United States Patent [19]

Schink

[11] 3,793,095

[45] Feb. 19, 1974

[54] METHOD FOR INDIFFUSING OR ALLOYING-IN A FOREIGN SUBSTANCE INTO A SEMICONDUCTOR BODY

[75] Inventor: Norbert Schink, Munich, Germany

[73] Assignee: Siemens Aktiengesellschaft, Berlin, Germany

[22] Filed: Apr. 19, 1971

[21] Appl. No.: 135,003

[30] Foreign Application Priority Data

Apr. 21, 1970 Germany .............. 2019251

[52] U.S. Cl. .............. 148/189, 148/186

[51] Int. Cl. .............. H01l 7/36, H01l 7/461

[58] Field of Search .............. 148/187, 189, 177

[56] References Cited

UNITED STATES PATENTS

| | | | |
|---|---|---|---|
| 2,929,750 | 3/1960 | Strull | 148/1.5 |
| 3,014,819 | 12/1961 | Hunter | 148/177 |
| 3,178,798 | 4/1965 | Marinace | 148/189 |
| 3,245,847 | 4/1966 | Pizzarello | 148/177 |
| 3,275,557 | 9/1966 | Hughes | 148/186 |
| 3,261,728 | 7/1966 | Kramp | 148/177 |
| 3,354,009 | 11/1967 | Mandel | 148/189 |
| 3,418,181 | 12/1968 | Robinson | 148/187 |
| 3,598,666 | 8/1971 | Addamiano | 148/189 |
| 3,442,725 | 5/1969 | Huffman | 148/189 |
| 3,450,581 | 6/1969 | Shortes | 148/186 |
| 3,607,450 | 9/1971 | Kiewit | 148/186 |
| 3,644,799 | 2/1972 | Weisshaar | 148/186 |
| 3,205,102 | 9/1965 | McCaldin | 148/189 |

*Primary Examiner*—Hyland Bizot
*Attorney, Agent, or Firm*—Herbert L. Lerner

[57] ABSTRACT

To remove atomic hydrogen which forms recombination centers from silicon wafers, the silicon wafers used for indiffusing or in-alloying a foreign substance, are heated in a closed processing vessel whereinto is placed a catalyst, preferably divalent lead ions, which accelerates the formation of molecular hydrogen from atomic hydrogen.

10 Claims, 1 Drawing Figure

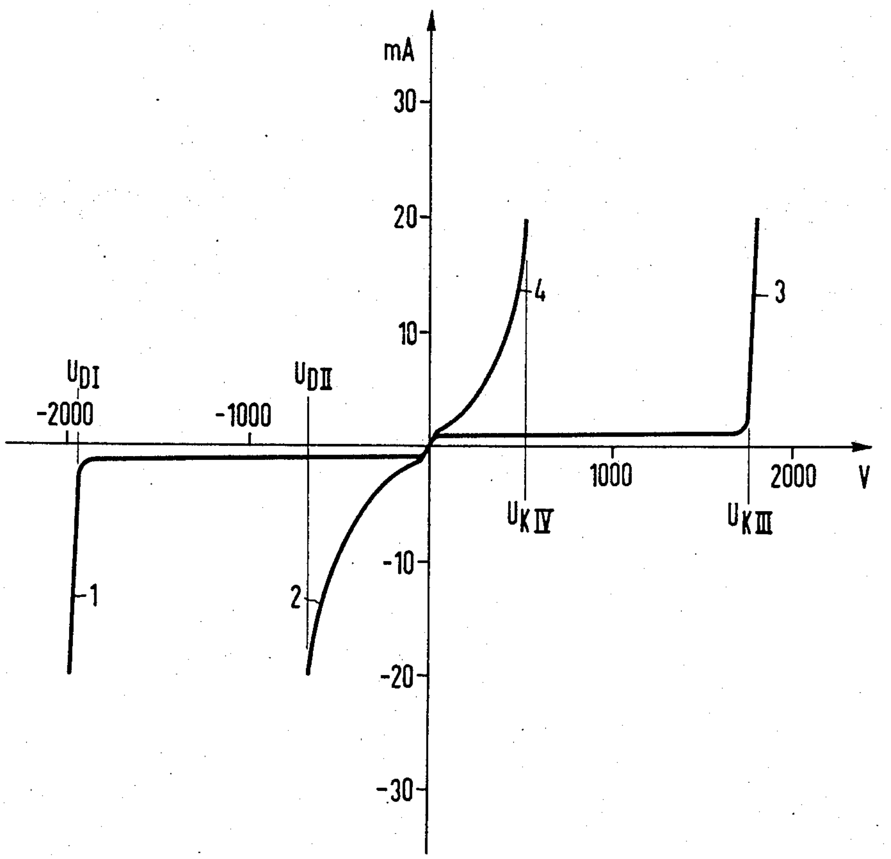
mA
30
20
10
-10
-20
-30
UDI
-2000
UDII
-1000
1000
2000
V
UKIV
UKIII
1
2
3
4

METHOD FOR INDIFFUSING OR ALLOYING-IN A FOREIGN SUBSTANCE INTO A SEMICONDUCTOR BODY

The present invention relates to a method for indiffusing or alloying-in a foreign substance into a semiconductor body, particularly of silicon or germanium, by heating the semiconductor body and the foreign substance in a closed processing vessel, in the presence of a catalyst that accelerates the formation of molecular hydrogen.

This may relate, e.g. to the indiffusion of dopant vaporized from a dopant source, into the semiconductor body or to the alloying-in of a metal foil into the semiconductor body with the formation of a contact electrode.

It is known from ZEITSCHRIFT FUER Naturforschung, Vol. 13*a*, Issue 4, 1958, pages 354 and 355, that hydrogen atoms which arrive in a silicon body during etching with concentrated nitric acid, hot sodium hydroxide or hydrofluoric acid, that contains glacial acetic acid or potassium permanganate, form recombination centers in the crystal lattice of the silicon. This shortens the life time of the minority carriers.

The present invention is based upon the recognition that molecular hydrogen also reaches the interior of the processing vessel, during diffusion or alloying from the material of the heated processing vessel. This molecular hydrogen dissociates into atomic hydrogen because of the high temperatures. The atomic hydrogen diffuses easily into the semiconductor body where it forms the aforementioned recombination centers.

The present invention thus has the object to remove as far as is possible, these hydrogen atoms from the semiconductor body so that the electrical characteristic, i.e. the breakdown voltage or maximum blocking voltage in the blocking direction in a rectifier, the flip flop voltage or maximum blocking voltage in forward direction and the breakthrough voltage, in a thyristor, of the component prepared from the semiconductor body will actually possess the predetermined values.

The object is achieved according to the present invention by the catalyst, prior to heating, to diffusion or alloying temperature is placed inside the processing vessel before the same is closed.

It is preferable to select a catalyst which is neither of an acceptor or a donor material and which forms almost no recombination centers in the semiconductor body. It is further preferred that relatively small amounts of this catalyst be required to catalyze the formation of molecular hydrogen. Particularly suitable to this end are divalent lead ions or a material which contains and delivers divalent lead ions, and which is installed in the processing vessel.

Due to the heat in the processing vessel, the catalyst material vaporizes unhampered to the surface of the semiconductor body, where it catalyzes during the cooling process following the indiffusion or the alloying-in of the foreign material, the formation of molecular hydrogen from atomic hydrogen. The catalyst accelerates the adjustment of the chemical equilibrium which is on the side of the molecular hydrogen, that is at room temperature. As a result thereof, the hydrogen atoms already present in the semiconductor, diffuse out during the cooling of the semiconductor body in the presence of the indicated catalyst, so that after the completion of the diffusion or alloying process, almost no hydrogen atoms are present in the semiconductor body, that is cooled to room temperature.

A method is known from French Pat. No. 1,293,554 for diffusing gallium into silicon wafers wherein the silicon wafers and the gallium source are arranged in a quartz ampule, which is then sealed and heated in a furnace so that the silicon wafers attain the required diffusion temperature. To getter undesired heavy metal atoms which stem from the furnace material, such as copper, nickel and iron and which form recombination centers in the silicon wafers, quartz ampule prior to heating is coated with a layer consisting of a mixture of sodium orthosilicate and lead oxide. This layer, however, is placed on the outside of the quartz ampule and not in its interior. As a result, so few lead ions reach the inside space of the quartz ampule, and the surface of the silicon wafers that hydrogen atoms which diffuse into the silicon wafers and which occur as a result of the dissociation of hydrogen molecules stemming from the quartz, remain in the silicon during the cooling following the diffusion process. The hydrogen molecules form undesired recombination centers.

The material which delivers divant lead ions, such as lead acetate, lead chloride or lead nitrate, may be placed in solid form into the processing vessel, prior to the execution of the diffusion or alloying process. Preferably, however, the surface of the body, which is situated within the processing vessel, and/or the inside area of the processing vessel, is wetted with a fluid containing a divalent lead ion which is vaporized in the open processing vessel prior to heating to processing temperature. One can also insert into the reaction vessel, a solid reaction body which wets with a divalent lead ion when vaporized in the open processing vessel prior to heating to processing temperature.

The invention and its advantages will be disclosed in greater detail with reference to an embodiment shown in the FIGURE.

The FIGURE shows the blocking and flip flop characteristics of two thyristors, one of which was produced according to the invention.

In an elongated, unilaterally opened quartz ampule, a doping source, e.g. gallium is arranged at one end and at the other end 50 silicon wafers with a diameter of 33 mm and a thickness of 300 $\mu$. The latter are held by support members made of silicon so that they do not contact the quartz ampule, in order to avoid crystal dislocations in the silicon wafers. Thereafter, the inner wall of the ampule is wetted with approximately 10 to 20 drops of a liquid, which contains 10 to 30 $\mu$grams of divalent lead ions per millimeter. Particularly suitable, for example, is water or alcohol wherein 60 $\mu$grams lead acetate, lead chloride or lead nitrate are dissolved per millimeter. It is advantageous to have, for each square centimeter of the total surface of all silicon wafers situated in the quartz ampule, 0.001 to 1 $\mu$grams (micrograms), preferably 0.02 $\mu$grams divalent lead ions, i.e. 0.002 to 2 $\mu$grams, preferably 0.04 $\mu$grams lead acetate, lead chloride of lead nitrate within the quartz ampule.

Following the wetting of the interior wall of the ampule with the liquid containing divalent lead ions, the unsealed ampule is heated to about 80 to 100°C and the liquid, i.e. water or alcohol, is vaporized off while the dissolved material containing divalent lead ions, remains on the inner wall of the ampule. Subsequently, the ampule is evacuated and fused, vacuum tightly. Finally, the ampule is inserted into a furnace which is heated during the specified diffusion time, at the end with the silicon wafers to a temperature of about 1,200°C and at the end with the gallium source to about 1,100°C.

It was found expedient for the wetting liquid to contain 20 micrograms lead ions per millimeter. It is also possible to wet the silicon wafers with the indicated liquid containing divalent lead ions, prior to heating to diffusion temperature and to vaporize said liquid prior to sealing the ampule.

Also, while gold foils which contain, e.g. a dopant, are alloyed into silicon wafers within a container that was placed into an alloying surface hydrogen atoms are preferably removed from the silicon wafers in the same manner as described above for diffusing in a quartz ampule.

The method of the invention is particularly characterized by the fast and very simple execution thereof. Another of its advantages is that only relatively small amounts of materials containing divalent lead ions are required, so that neither the processing vessel nor the semiconductor body to be treated is affected by the processing vessel.

In the FIGURE, curve 1 is the blocking characteristic and curve 3 the flip flop characteristic of a first silicon thyristor with a silicon wafer having a diameter of 33 mm and a thickness of 300 $\mu$ that had been heated together with 50 silicon wafers of the same size as well as a dopant source for indiffusing doping material, in a sealed quartz ampule whose inside wall was wetted, prior to sealing, with 15 drops of water than contained 40 micrograms lead acetate per millimeter. The water was vaporized off before the ampule was sealed.

For comparison, curves 2 and 4, respectively, represent the blocking and flip flop characteristics of a second silicon thyristor of the same construction and of a silicon wafer which has the same dimensions and was severed from the same original rod as was the silicon wafer of the first thyristor. Into the silicon wafer of the second thyristor, the dopant was diffused, inside a sealed quartz ampule which contained no divalent lead ions or any other catalyst which accelerates the formation of molecular hydrogen from atomic hydrogen.

As can be seen the breakthrough voltage $U_{dI}$ and the flip flop voltage of the first thyristor is considerably greater than the breakthrough (breakdown) voltage $U_{dII}$;flip flop voltage $U_{kII}$ of the second thyristor.

I claim:

1. A method of treating a semiconductor body of silicon or germanium containing a dopant substance, which comprises placing said semiconductor body and a lead salt catalyst delivering divalent lead ions, that accelerate the formation of molecular hydrogen into a vessel, evacuating said vessel, sealing said vessel with an air tight seal, and heating said vessel to an elevated temperature at which dopant substance contained in said vessel passes into the semiconductor body and at which molecular hydrogen is formed from the material of which the vessel is made.

2. The process of claim 1 wherein said dopant substance is indiffused into said semiconductor body.

3. The process of claim 1 wherein said dopant substance is alloyed into said semiconductor body.

4. The process of claim 1 comprising wetting the surface of said semiconductor body with a liquid containing said catalyst and heating said vessel to vaporize said liquid and leave a residue of said catalyst on said semiconductor body prior to heating to said processing temperature.

5. The process of claim 4, wherein said liquid contains 10 to 30 micrograms divalent lead ions per milliliter.

6. The process of claim 4, wherein said liquid is selected from water and alcohol and contains dissolved therein a material selected from lead acetate, lead chloride and lead nitrate.

7. The process of claim 1 comprising wetting the inside area of said vessel with a liquid containing said catalyst and heating said vessel to vaporize said liquid and leave a residue of said catalyst on said inside area of said vessel prior to heating to said processing temperature.

8. The process of claim 7 wherein said liquid contains 10 to 30 micrograms divalent lead ions per milliliter.

9. The process of claim 7 wherein said liquid is selected from the group consisting of water and alcohol and contains dissolved therein a lead salt selected from the group consisting of lead acetate, lead chloride and lead nitrate.

10. The process of claim 1 wherein said catalyst is selected from the group of lead salts consisting of lead acetate, lead chloride and lead nitrate.

* * * * *